(12) United States Patent
Groth

(10) Patent No.: US 7,357,886 B2
(45) Date of Patent: Apr. 15, 2008

(54) SINGULAR MOLDED AND CO-MOLDED ELECTRONIC'S PACKAGING PRE-FORMS

(76) Inventor: Lauren A. Groth, 13011 Bristolberry Dr., Cypress, TX (US) 77429

( * ) Notice: Subject to any disclaimer, the term of this patent is extended or adjusted under 35 U.S.C. 154(b) by 447 days.

(21) Appl. No.: 10/699,130

(22) Filed: Oct. 31, 2003

(65) Prior Publication Data

US 2005/0093201 A1   May 5, 2005

(51) Int. Cl.
B29C 33/40   (2006.01)
B29C 45/76   (2006.01)
B29C 70/88   (2006.01)

(52) U.S. Cl. ............... 264/40.1; 264/225; 264/255; 264/272.11; 264/272.13; 264/272.17

(58) Field of Classification Search ............. 264/225, 264/272.11, 40.1, 255, 272.13, 272.17
See application file for complete search history.

(56) References Cited

U.S. PATENT DOCUMENTS

| | | | |
|---|---|---|---|
| 3,204,385 A * | 9/1965 | De Remer et al. ............ 53/412 |
| 4,480,975 A * | 11/1984 | Plummer et al. ............ 425/116 |
| 4,701,999 A * | 10/1987 | Palmer ....................... 29/827 |
| 4,829,403 A * | 5/1989 | Harding ..................... 361/704 |
| 4,891,734 A | 1/1990 | More et al. |
| 5,106,785 A * | 4/1992 | Rauchmaul et al. .......... 29/856 |
| 5,285,559 A * | 2/1994 | Thompson et al. ........... 29/841 |
| 5,366,664 A * | 11/1994 | Varadan et al. ............. 252/512 |
| 5,376,824 A * | 12/1994 | Rauchmaul et al. ........ 257/666 |
| 5,543,103 A * | 8/1996 | Hogan et al. ............... 264/219 |
| 5,658,506 A * | 8/1997 | White et al. ................ 264/28 |
| 6,233,155 B1 * | 5/2001 | Moster et al. .............. 361/752 |
| 6,444,148 B2 * | 9/2002 | Harding ..................... 264/40.1 |
| 6,641,767 B2 * | 11/2003 | Zhang et al. ............... 264/220 |

* cited by examiner

Primary Examiner—Leo B. Tentoni
(74) Attorney, Agent, or Firm—Butzel Long

(57) ABSTRACT

Molded pre-forms that are used to protect electronic components and assemblies from damage due to vibration, shock and/or thermal exposure. The pre-forms can be singularly molded or co-molded. Co-molded pre-forms can include hard surface layers over softer molded compositions. The pre-forms are molded in molds that are formed using modified images obtained from printed circuit boards having the electronic components thereon. Images of the printed circuit boards are obtained and modified to improve vibrational dampening and/or heat transfer. The molded pre-forms allow for access to the printed circuit boards for purposes of replacing or repairing the printed circuit boards. The molded pre-forms are particularly suitable for down hole applications.

10 Claims, 4 Drawing Sheets

SINGULAR MOLDED AND CO-MOLDED ELECTRONIC'S PACKAGING PRE-FORMS

TECHNICAL FIELD

The present invention relates to protecting electronic components and assemblies from damage due to vibration, shock and/or thermal exposure. More particularly, the present invention is directed to the production and use of molded pre-forms and their use to protect electronic components and assemblies from damage due to vibration, shock and/or thermal exposure. Particular features of the present invention relate to use of singular molded and co-molded pre-forms in "down hole" applications in drill and wire line strings in wells.

BACKGROUND ART

Electronic component assemblies that are used in "down hole" applications in well drilling logging and measurement activities are subject to significant vibration and shock present in the drill string axial direction, along both transverse axes, and rotational acceleration about the axis and high heat/thermal exposure. The electronic component assemblies survive long hours down hole only if: (1) the mounting support offers protection from acceleration induced forces that cause relative strain between components and (2) there is a sufficient heat conduit in place to transfer the heat generated by the printed circuit board (PCB) so that PCB damage does not occur. Failures result too often and have serious economic consequence.

Known mounting methods involve supporting printed circuit boards on structures called "Subs" and or chassis and suspending the assemblies in confining, pressure proof, enclosures. The pressure proof enclosures are attached to drill strings to which drill bits are attached or wire line strings where there is not drill bit attached. During a drilling operation, the drill strings are the origin of the most serious shock and linear vibration. The acceleration forces generated during drilling are transmitted by way of the drill string to the enclosure and the attached "Sub" or chassis to the electronic assembly and components. Failure of the electronic component assemblies results when: (1) the acceleration forces cause relative motion between PCBs and their attached components and or (2) high heat/thermal exposure damages the PCB since there is no conduit in place to pull the heat from the PCB and transfer it to.

Two currently used mounting options include; (1) attachment of PCBs to strongbacks with screws, with a sheet of Elastomer captured between PCBs and strongbacks and, (2) positioning PCBs in openings, or cavities, in "Subs" and filling the remaining volume with elastomer that is cast and cured in place. Although and used more frequently is when the PCB is placed in a mold (that accurately fits the geometry of the cavity in the "Sub") cast or encapsulated, cured, removed from the mold and inserted into the cavity in the "Sub" or directly into the confining structure such as a pressure barrel. In both cases, the chassis and or "Sub," with the electronic assemblies in place, are inserted in the bore of a confining structure, such as a tubular pressure barrel. In many cases the electronic assembly (encapsulated PCB) is placed directly into a confining structure cavity, such as a pressure barrel.

The first mounting option causes stress concentrations at the screws where acceleration forces are transmitted from the chassis and or "Sub" to the PCBs. In addition, temperature changes cause relative thermal expansion between PCBs and "Subs" or chassis and strains the screw attachment points.

The second mounting option provides cushioning for all components against acceleration forces delivered through the strongback. However, differential thermal expansion between the elastomer and "Sub" causes forced migration of elastomer in unpredictable amounts and directions. As a result, destructive strains force relative movement between PCB and attached components.

U.S. Pat. No. 4,891,734 to More et al. provides a mounting option that is based upon the premise that the ideal support for electronic components will cushion all components about equally, will allow inevitable elastomer migration, very localized, in known directions and in known amounts, and that small movements allowed by cushioning can be accommodated by free moving conductors sufficiently short and supported to prevent their becoming a vibrating independent mass.

U.S. Pat. No. 4,891,734 to More et al. discloses enclosing electronic assemblies in elastomeric bodies that are separately molded to fit the confining enclosures of strongbacks that are provided with cavities for the elastomeric bodies and configured to be received in tubular shrouds. The electronic assemblies are positioned in molds shaped to represent the cavities of the strongbacks and elastomeric material is cast around the assembly. Only a connector is exposed at the elastomer surface.

The present invention provides molded pre-forms, methods to fabricate the molded pre-forms, and their use to protect electronic components and assemblies from damage due to vibration, shock and/or thermal exposure. Particular features of the present invention relate to use of singular and co-molded pre-forms in "down hole" applications in drill and wire line strings in wells.

DISCLOSURE OF THE INVENTION

According to various features, characteristics and embodiments of the present invention which will become apparent as the description thereof proceeds, the present invention provides a method of protecting electrical assemblies fabricated on printed circuit board which comprises:

providing a printed circuit board having an electrical assembly formed thereon, the printed circuit board having an upper surface and a lower surface, the upper surface of the printed circuit board having a topography defined by the size, shape and location of individual components of the electrical assembly;

providing a first molded form configured to cover the upper surface of the printed circuit board, the first molded form having an inner surface which is substantially complementarily shaped to the topography of the upper surface of the printed circuit board, providing a second molded form configured to cover the lower surface of the printed circuit board;

securing the printed circuit board between the first and second molded forms to protect the electrical assembly from damage caused by at least one of vibration, shock and thermal changes.

The present invention further provides a method of fabricating a molded form used to protect an electrical assembly provided on a printed circuit board which method comprises:

providing a printed circuit board having an electrical assembly formed thereon and having an upper surface and a lower surface, the upper surface of the printed circuit board having a topography defined by the size, shape and location of individual components of the electrical assembly;

producing an electronic image of the upper surface;

modifying the electronic image of the upper surface;

fabricating a mold/tool for injection molding a molded form (pre-form) that is substantially complementarily shaped to the topography of the upper surface of the printed circuit board, the mold being complementarily shaped to the topography of the upper surface of the printed circuit board by an operation that utilizes the modified electronic image of the upper surface of the printed circuit board; and injection molding a pre-form using the tool/mold.

The present invention also provides for molded and co-molded pre-forms.

BRIEF DESCRIPTION OF DRAWINGS

The present invention will be described with reference to the attached drawings which are given as non-limiting examples only, in which.

BEST MODE FOR CARRYING OUT THE INVENTION

Figure 1:
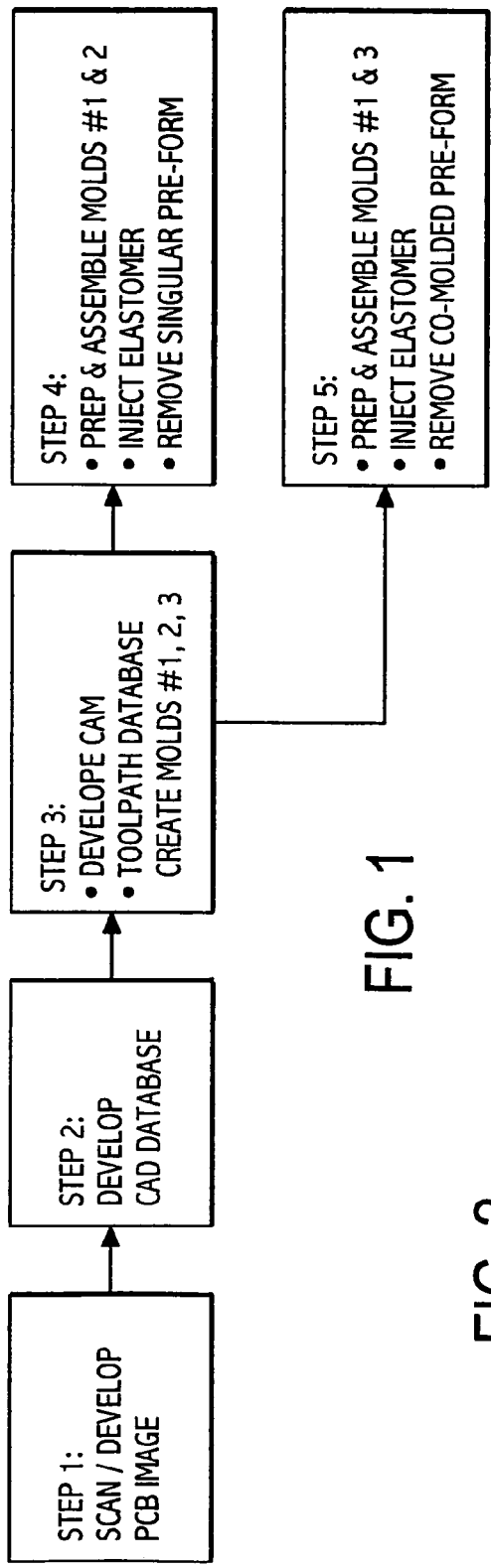
FIG. 1 is a flowchart which shows the steps involved in fabricating molded and co-molded pre-forms according to one embodiment of the present invention.

The present invention is directed to molded pre-forms, methods for fabricating the molded pre-forms, and the use of the molded pre-forms to protect electronic components and assemblies from damage due to vibration, shock and/or thermal exposure. Particular features of the present invention relate to use of singular and co-molded pre-forms in "down hole" applications in drill and wire strings in wells.

The molded pre-forms of the present invention are made from virtually any elastomer composition that is sufficiently heat resistant and suitable for absorbing anticipated vibration and/or shock. The elastomer compositions that are thermally conductive can be used to transfer (act as a conduit) heat from electronic components to other support structures, heat sinks or cooling structures and chassis or "Sub." Exemplary elastomers include silicone based compositions with platinum based silicones being one particular example. The thermally conductive elastomer identified as 3-6655 and available from Dow Corning was determined to be particularly useful for purposes of the present invention. Another composition from Dow Corning identified as 3-6751 is a thermally conductive adhesive which was used to produce the hard thin outer layer. (It was not mixed with 3-6655).

The present invention provides several types of molded pre-forms including those that are not reinforced, those that are reinforced by adding therein materials such as fiberglass scrim weave, carbon fiber, fiberglass structures those that are reinforced by embedding inserts therein, and those that are co-molded so as to have two or more layers having different properties. Examples of embedded inserts include metal mesh and metal foils which can provide for emi shielding, and heat sinks including cables, wires and other metal structures.

The pre-forms of the present invention were initially designed for use in conjunction with printed circuit boards (PCB) and other electronics packaging systems which, when in use, are subject to vibration and/or over heating. Although the pre-forms of the present invention are described herein for exemplarily purposes with reference to "down hole" applications, it is to be understood that the pre-forms of the present invention can be used in conjunction with virtually any PCB or electronics package or assembly.

As noted above, various embodiments of the present invention include singular molded pre-forms (also referred herein as simply "molded pre-forms), and co-molded per-forms.

Singular molded pre-forms are molded from one elastomer composition such as in the case of "down hole" application a thermally conductive material with shock damping characteristics or vice versa. Singular molded pre-forms lay like a blanket over a PCB to act as a: (1) path (conduit) to transfer heat from the PCB to a chassis, Sub or other structure; and (2) "sponge" to absorb vibration.

Co-molded pre-forms were developed according to the present invention to better facilitate the use of elastomer materials that after molding are may be soft and "sticky" and therefore difficult to slide into an enclosure or assembly (pressure housing)?

Co-molded pre-forms are molded from/with two or more materials. Co-molded pre-forms can use the same singular molded material to blanket a PCB (to provide vibration damping and/or thermal conduit); however, they also have a hard outer thin shell that facilitates sliding of a resulting enveloped PCB into an enclosure or assembly.

The molded and co-molded pre-forms of the present invention provide a convenient alternative to PCB potting and encapsulation applications. One particular aspect of the present invention is that the molded and co-molded pre-forms are easily removed and re-applied, allowing repair or replacement of individual components of a PCB. Potted and encapsulated PCBs are typically replaced rather than repaired, because the individual components are not accessible through the potting or encapsulation materials.

As will be understood from the description of the invention which follows, the molded and co-molded pre-forms of the present invention can be selectively configured to be optimized for heat management or for vibration or shock damping.

The molded and co-molded pre-forms of the present invention are fabricated by a unique process which involves producing an image of a PCB and using the image to fabricate a set of molds which are configured to match the shape of the PCB and dimensionally configured to optimize heat management and/or vibration or shock damping.

The fabricated tools/molds are used to injection mold the molded pre-forms and the co-molded pre-forms. According to one embodiment of the present invention which is discussed in detail below, a single set of three molds can be used to form either a molded pre-form or a co-molded pre-form for a given PCB.

FIG. 1 is a flowchart which shows the steps involved in fabricating molded and co-molded pre-forms according to one embodiment of the present invention.

Figure 2:
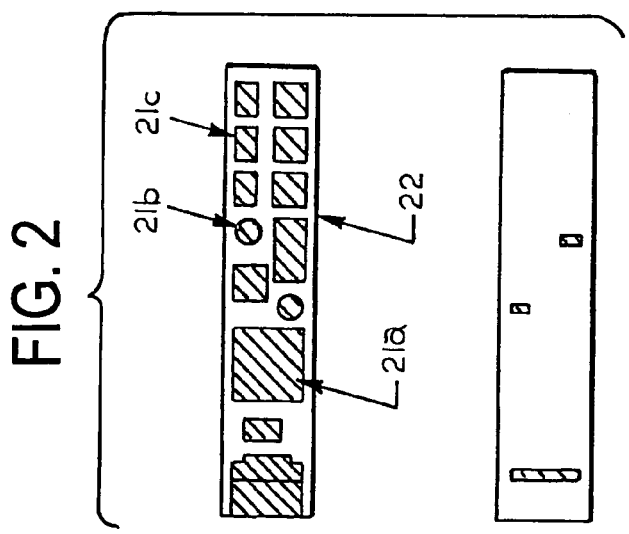
FIG. 2 depicts an image of a PCB that was obtained by simply placing a PCB board on a flat bed scanner and scanning the PCB to produce an image file.

In step 1 an image of a PCB is produced. According to one embodiment of the present invention a PCB is scanned using any known scanning means or method capable of producing an image of the PCB. FIG. 2 depicts an image of a PCB that was obtained by simply placing a PCB on a flat bed scanner and scanning the PCB to produce a TIF file image. Other image formats such as jpg, bmp, and etc). The image 20 of the PCB in FIG. 2 depicts various electronic components 21a, 21b, 21c . . . 21 . . . which are mounted on printed circuit board 22. As depicted, the electronic components 21a, 21b, 21c . . . 21 . . . have different shapes and sizes which, according to the present invention are evaluated and used to produce molded pre-forms and co-molded pre-forms which conform to the overall configuration of the PCB.

In step 2 the image of the PCB is manipulated by a computer program to produce a CAD file. During the course of the present invention SolidWorks® was used to produce the CAD file and manipulate the CAD file image. For example, individual components are blocked out leaving approximately 0.03 to 0.05 inches around each component. This clearance space which can be larger will compensate for variances in the position of electrical components on similar PCBs which may vary. The height of each component is measured. If thermal heat transfer/dissipation is the principle concern, the heights of the components in the CAD image are manipulated by subtracting about 0.02 inches from the measured heights of the components. This manipulation or adjustment will ensure that the mold will produce a molded or co-molded pre-form that puts a pre-load on top of each component and establishes a direct path for heat to travel.

If vibration and shock damping are principle concerns, the heights of the components in the CAD image are manipulated by adding about 0.03 inches to the measured heights of the components.

Figure 3:
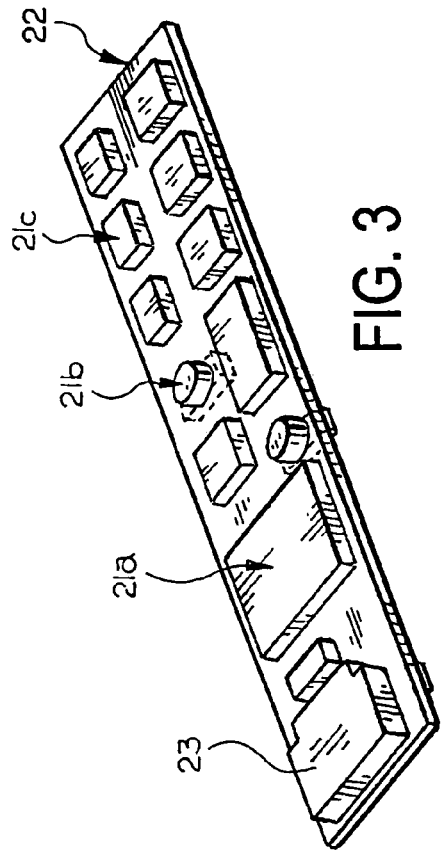
FIG. 3 is a CAD image of the scanned PCB of FIG. 2.

FIG. 3 is a CAD image of the scanned PCB of FIG. 2. As can be seen in FIG. 3, the CAD image has substantially identical structures for each of the individual components found in the scanned image of FIG. 2 with a structure 23 included to provide access to connect a lead to the PCB.

In step 3 of FIG. 1, the modified CAD image is used to fabricate molds for molding the molded pre-forms and co-molded pre-forms. There are a number of computer programs available that can control the operation of machining equipment such as mills, rapid prototyping machines, silicon tooling machines, etc. that can be used to fabricate molds for the pre-forms. In an exemplary embodiment of the present invention, the a computer software program called MasterCam® used the CAD image file to control a CNC mill which was used to fabricate a set of three molds which can be used to mold molded pre-forms and co-molded pre-forms.

Figure 4A:
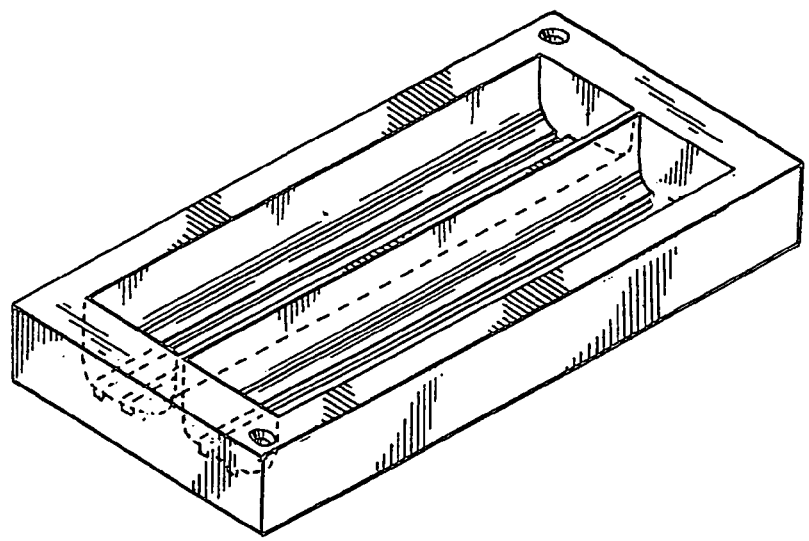
FIGS. 4a-4c show a set of three molds that were made according to the present invention.
Figure 4B:
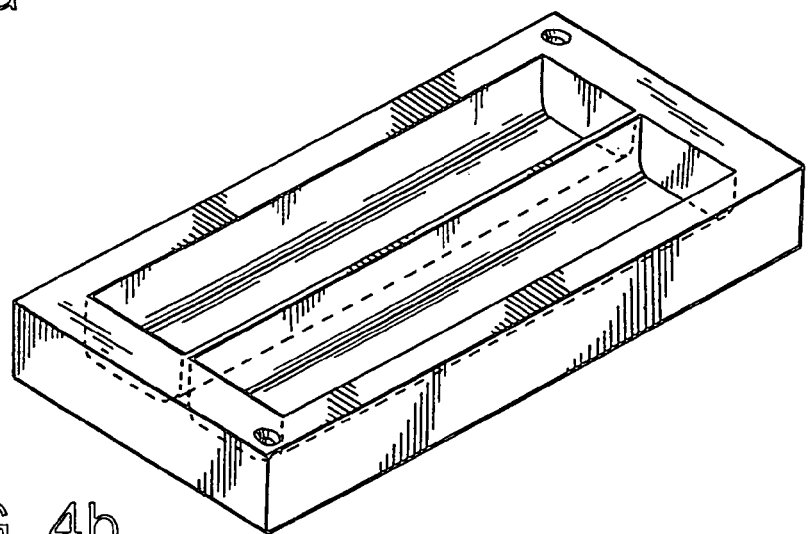
Figure 4C:
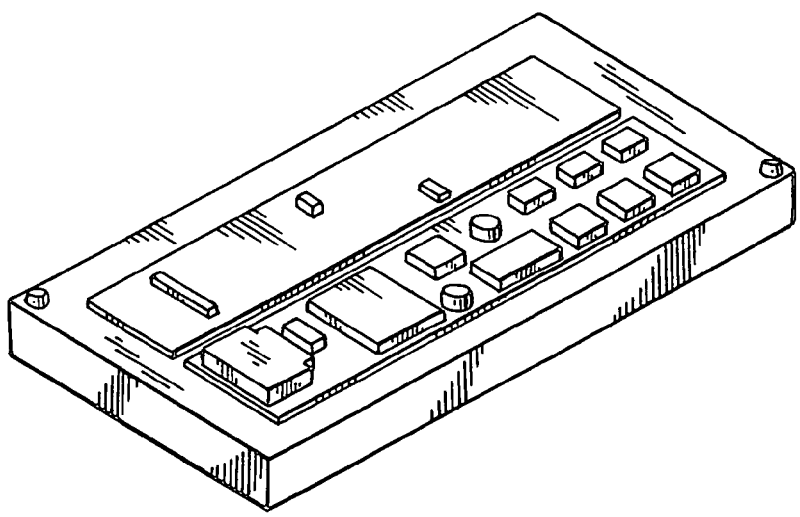

FIGS. 4a-4b show a set of three molds that were made by a CNC mill using MasterCam® according to the present invention. The first and second molds shown in FIG. 4 are used to mold a singular molded pre-form. The first and third molds shown in FIGS. 4c and 4a are used to mold the thin hard shell on the co-molded performs as explained in detail below.

In step 4 of FIG. 1, a singular molded pre-form is molded. Using the molds shown in FIGS. 4a-4c, the first and second molds shown in FIGS. 4c and 4b are used to mold a singular molded pre-form. In order to provide some structural rigidity to the molded pre-form, an insert such as a fiberglass scrim is placed in the mold assembly before an elastomer composition is injected into the mold assembly. Other insert materials can be used including metal mesh or foil inserts which can provide for emi shielding. Also, heat sinks, including cables, wires and other metal structures can be embedded into the molded pre-forms. Stiffener materials such as flat, round or tubular configurations can also be added to the elastomer composition to improve the rigidity of the molded pre-forms.

After the elastomer composition is injected into the mold assembly, the mold assembly can be heated as desired to cure the elastomer composition.

The resulting molded pre-form can be removed from the mold assembly and used "as is." Alternatively, the molded pre-form can be subjected to an additional molding process to form the co-molded pre-forms of the present invention.

In step 5 of FIG. 1, a co-molded pre-form is molded. Using the molds shown in FIGS. 4a-4c, the first and third molds shown in FIGS. 4c and 4a are used to mold a shell of a second harder material on the singular molded pre-form. If a co-molded pre-form is desired, the molded pre-form produced in step 4 should not be removed from the first mold shown in FIG. 4c. With the molded pre-form attached to the first mold shown in FIG. 4c, the first and second molds shown in FIGS. 4c and 4b are assembled together with the molded pre-form therein and a small clearance space between the outer surface of the molded pre-form and the inner surface of the third mold. A second composition that forms a hard shell is injected into the mold assembly. In an exemplary embodiment, the molded pre-form was produced using Dow Corning's 3-6655 elastomer composition and the hard shell was produced using Dow Corning's 3-6751 adhesive composition.

After the shell forming composition is injected into the mold assembly, the mold assembly can be heated as desired to cure the composition and produce a co-molded pre-from. It is of course possible to produce co-molded performs using more that two compositions.

After curing, the molded pre-form and/or co-molded pre-form are subject to finishing treatments, including removal of flash trim.

The molded and co-molded pre-forms of the present invention can be in the form of separate pre-forms pieces between which a PCB is sandwiched or a "clam-shell" structure in which a PCB is received.

Figure 5:
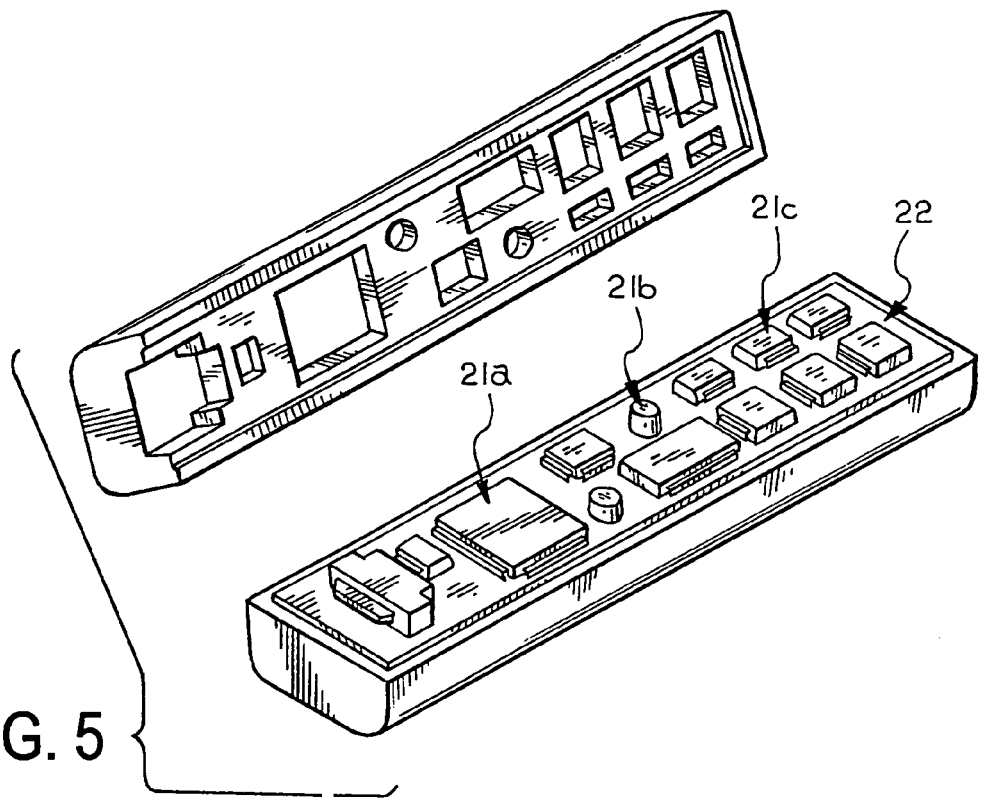
FIG. 5 shows a singular molded pre-form, with seated PCB, produced according one embodiment of the present invention.

FIG. 5 shows a molded pre-form produced according one embodiment of the present invention. The molded pre-form above the PCB is lifted from the PCB to show the PCB. A similar molded pre-form is provided beneath the PCB in FIG. 5. The overlapping peripheral edges of the molded pre-forms which extend outward beyond the peripheral edge of the PCB can be sealed together with a suitable adhesive or glue. Alternatively, the PCB can be secured between the two portions of the molded pre-forms using mechanical means including tape, clips and adjacent support structures.

Figure 6:
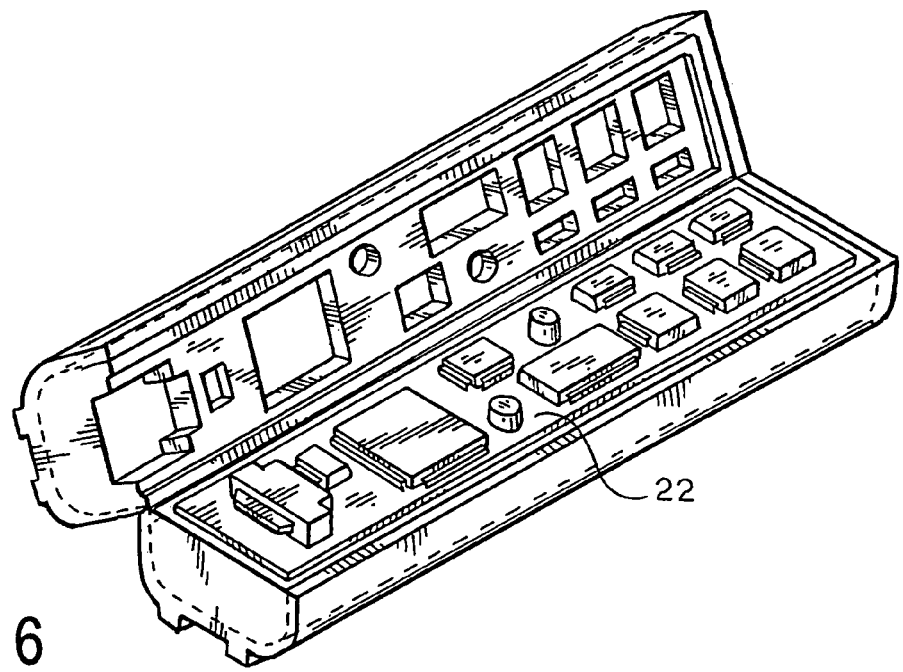
FIG. 6 shows a "clam-shell" or hinged co-molded per-form in an open position having a PCB therein.

FIG. 6 shows a "clam-shell" or hinged co-molded perform in an open position having a PCB therein. As can be seen, the inner surface of the upper portion of the co-molded perform shown in FIG. 6 includes recessed portions which are complementary shaped to the electronic components which are to be received in the recessed portions. As in the case of the molded pre-form shown in FIG. 5, the overlapping peripheral edges of the upper and lower portions of the co-molded pre-form which extend outward beyond the peripheral edge of the PCB can be sealed together with a suitable adhesive or glue. Alternatively, the PCB can be secured between the two portions of the co-molded pre-forms using mechanical means including tape, clips and adjacent support structures.

The hinge structure between the upper and lower portions of the co-molded (or molded) pre-forms can be reinforced by a scrim or other structure embedded in the pre-molds.

Figure 7:
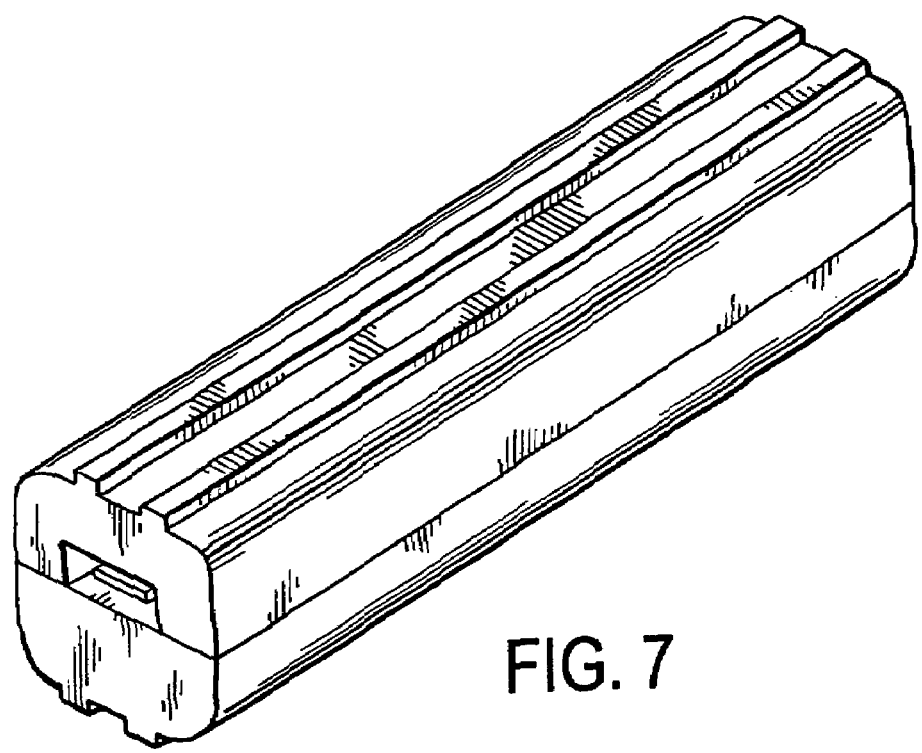
FIG. 7 shows a "clam-shell" or hinged co-molded per-form in a closed position.

FIG. 7 shows a "clam-shell" or hinged co-molded perform in a closed position. The outer surface of the co-molded pre-form can be provided with ridges. The ridges which will be formed predominately if not exclusively of the composition used to for the hard shell will limit surface area and friction so as to enable the co-molded perform to be slid into an enclosure or assembly. The space between the ribs are used to accommodate thermal expansion also.

Figure 8:
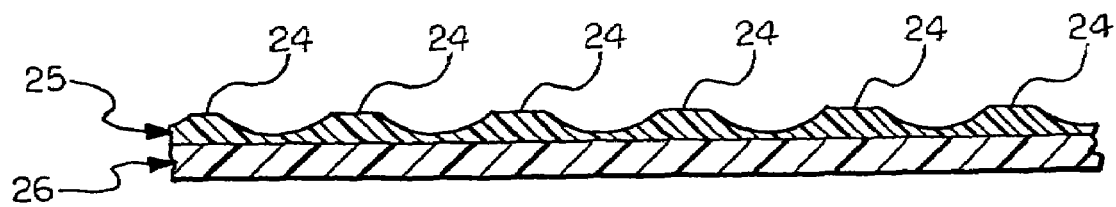
FIG. 8 is a cross-sectional view of a section of a co-molded pre-form according to the present invention.

FIG. 8 is a cross-sectional view of a section of a co-molded pre-form which shows ridges 24 that are formed predominately if not exclusively of the composition used to for the hard shell 25. The underlying molded composition is identified by reference number 26 in FIG. 8.

Once sealed, the molded and co-molded pre-forms of the present invention are highly re-enterable. To open the sealed pre-forms, a knife is inserted along the parting line (between the upper and lower halves) and pre-forms are cut open. Once the assembly is opened the PCB board can be replaced or repaired and the pre-forms can be resealed by using a small amount of adhesive applied along the edges of the pre-molds. The ability to quickly replace and/or repair a PCB results in a huge cost saving by not having to "trash" the PCB. Moreover the ability to easily replace the PCB allows for easy upgrading.

The molded and co-molded pre-forms of the present invention help eliminate or significantly reduce board failure due to thermal expansion of the Elastomer material that is intended to protect the boards. This is accomplished by building a thermal expansion factor (typically 0.03" to 0.05") around each component of the PCB. In addition, since the pre-forms are not mechanically attached to the PCB, unlike encapsulation, the pre-forms can be removed without occurring damage.

The molding compositions can include conventional additives such as pigments, fillers, etc. Moreover while the molding process is not discussed in undue detail, conventional molding techniques including preparing and cleaning of mold surfaces and the use of release agents can be used in the molding process of the present invention.

Although the present invention has been described with reference to particular means, materials and embodiments, from the foregoing description, one skilled in the art can easily ascertain the essential characteristics of the present invention and various changes and modifications can be made to adapt the various uses and characteristics without departing from the spirit and scope of the present invention as described above.

What is claimed is:

1. A method of fabricating a molded form used to enclose and protect an electrical assembly provided on a printed circuit board which method comprises:
    providing a printed circuit board having an electrical assembly formed thereon and having an upper surface and a lower surface, the upper surface of the printed circuit board having a topography defined by the size, shape and location of individual components of the electrical assembly;
    producing an electronic image of the upper surface;
    modifying the electronic image of the upper surface by measuring the heights of the individual components of the electrical assembly and either adding a factor to the measured heights or subtracting a factor from the measured heights;
    fabricating a mold for injection molding a molded form that is substantially complementarily shaped to the topography of the upper surface of the printed circuit board, said mold being complementarily shaped to the topography of the upper surface of the printed circuit board by an operation that utilizes the modified electronic image of the upper surface of the printed circuit board, said mold including protrusions that are complementarily shaped to individual ones of the components of the electrical assembly; and
    injection molding a molded form using the mold which molded form is configured to enclose and protect an electrical assembly provided on a printed circuit board, the molded form having recesses formed by the protrusions, which recesses are complementarily shaped to individual ones of the components of the electrical assembly and configured to receive individual ones of the components of the electrical assembly.

2. A method of fabricating a molded form used to protect an electrical assembly provided on a printed circuit board according to claim 1, wherein the electronic image is modified by adjusting for space around each of the individual components of the electrical assembly.

3. A method of fabricating a molded form used to protect an electrical assembly provided on a printed circuit board according to claim 1, wherein the molded form is co-molded.

4. A method of fabricating a molded form used to protect an electrical assembly provided on a printed circuit board according to claim 3, wherein the co-molded form comprises a outer surface layer that is harder than a central portion of the co-molded form.

5. A method of fabricating a molded form used to protect an electrical assembly provided on a printed circuit board according to claim 4, wherein the outer surface layer has ridges formed therein.

6. A method of fabricating a molded form used to protect an electrical assembly provided on a printed circuit board according to claim 1, wherein the molded form comprises upper and lower molded form portions.

7. A method of fabricating a molded form used to protect an electrical assembly provided on a printed circuit board according to claim 6, wherein the upper and lower molded form portions are coupled together by a hinge.

8. A method of fabricating a molded form used to protect an electrical assembly provided on a printed circuit board according to claim 1, wherein an embedded structure is molded into the molded form.

9. A method of fabricating a molded form used to protect an electrical assembly provided on a printed circuit board according to claim 8, wherein the embedded structure comprises at last one of a rigid structure, an emi shield and a thermal conductor.

10. A method of fabricating a molded form used to protect an electrical assembly provided on a printed circuit board according to claim 1, wherein the electrical assembly comprises an assembly that is used in down hole applications.

* * * * *